(12) United States Patent
Shimada et al.

(10) Patent No.: US 6,339,543 B1
(45) Date of Patent: Jan. 15, 2002

(54) WRITING METHOD FOR A MAGNETIC IMMOVABLE MEMORY AND A MAGNETIC IMMOVABLE MEMORY

(75) Inventors: Yutaka Shimada; Valentyn Novosad; Yoshichika Otani; Kazuaki Fukamichi; Osamu Kitakami, all of Sendai (JP)

(73) Assignee: Tohoku University, Sendai (JP)

( * ) Notice: Subject to any disclaimer, the term of this patent is extended or adjusted under 35 U.S.C. 154(b) by 50 days.

(21) Appl. No.: 09/580,634

(22) Filed: May 30, 2000

(30) Foreign Application Priority Data

Sep. 24, 1999 (JP) ............................................. 11-269885

(51) Int. Cl.⁷ ............................................... G11C 11/00
(52) U.S. Cl. ......................... 365/157; 365/148; 365/158
(58) Field of Search ................................. 365/157, 145, 365/158, 65, 50, 33

(56) References Cited

U.S. PATENT DOCUMENTS 4,159,539 A  *  6/1979 Tournois et al. ............ 365/157

* cited by examiner

*Primary Examiner*—David Nelms
*Assistant Examiner*—David Lam
(74) *Attorney, Agent, or Firm*—Oliff & Berridge, PLC

(57) ABSTRACT

A lattice shaped underlayer made of a ferroelectric material having a piezoelectric effect is formed on a substrate. On the crossing points of the underlayer magnetic films with a magnetoelastic effect are formed. By applying a voltage to the given column and row of the underlayer, the underlayer is stressed at the crossing point. Then the stress is transmitted to the magnetic film on the same crossing point making the magnetization reverse through the magnetoelastic effect, thus, carrying out writing to the MRAM.

10 Claims, 2 Drawing Sheets

WRITING METHOD FOR A MAGNETIC IMMOVABLE MEMORY AND A MAGNETIC IMMOVABLE MEMORY

BACKGROUND OF THE INVENTION

1. Field of the Invention

This invention relates to a writing method for a magnetic random access solid state memory (MRAM) and a magnetic random access memory, more particular a writing method for a MRAM which are preferably usable, in a harsh condition, for example, in an aerospace system.

2. Description of the Prior Art

Recently, semiconductors have achieved a very high recording density at a high speed. In contrast a MRAM using a magnetization in a magnetic film, which was proposed a long time ago, cannot have a recording density competing with that of semiconductor RAM memories because MRAM because of delay of the magnetic film technology compared with that of the semiconductor films. Recently, however, micro-pattering technique of magnetic thin films has developed rapidly and much attention is being paid to the essential stability (radioactive resistance and thermal stability) of MRAM mainly in industries of the United States.

FIG. 1 is a schematic view explaining writing method of conventional MRAM. The conventional MRAM, as shown in FIG. 1, has electrodes connected to vertical wires Lx1–Lx5 and lateral wires Ly1–Ly5 that are patterned orthogonal. On each crossing point of the wires there are magnetic film component as indicated with a1–e5.

Writing this MRAM is performed by reversing the magnetic flux of the film C3, for example. The flux reversal is made by flowing current to the wire Lx3 and Ly3 from an external power source, giving rise to a magnetic field strong enough for flux reversal. For reading the written information the magnetization direction of the film C3 is detected by a magnetic sensor positioned near it.

MRAM has intrinsically a higher speed of writing than that of semiconductors. Moreover, MRAM is composed of metallic layers such as magnetic films. This leads to an advantage of easier micro patterning and, furthermore, metallic materials have a conduction electron density higher than that of carriers in semiconductors by several orders of magnitude. This leads to a high potential of ultra-high integration of elements.

However, writing of MRAM developed so far is carried out with a strong magnetic field by current pulses in the crossing wires as described above. Consequently, the current results in ohmic heating in the wires giving rise to temperature increase of the element. So, as a memory density increases, the ohmic heat brings about destruction of the element or unstable operation. This limits the memory density of MRAM.

Moreover, concentration of a strong magnetic field within a limited area near the magnetic film is extremely hard. This also limits integration density of MRAM.

It is an object of the present invention to provide a new writing system for MRAM and a new MRAM that eliminates the problem describe above.

This invention relates to a writing method for MRAM comprising the steps of:

forming, on a substrate, a lattice shaped underlayer of a ferroelectric material having a piezoelectric effect, forming, on the crossing points of the underlayer, films of a magnetic material having a magnetoelastic effect, and applying a certain voltage to a given row and column of the underlayer and thereby, reversing the magnetic flux of the film on the crossing point, whereby writing of MRAM is performed.

This invention also relates to MRAM comprising of a substrate, an underlayer made of a ferroelectric material having an piezoelectric effect, magnetic films made of a magnetic material having a magnetoelastic effect, the underlayer being formed in a lattice shape on the substrate, magnetic films being formed on the crossing points of the lattice underlayer.

The inventors have studied intensively to figure out a new writing method for MRAM and a new MRAM to put the writing method into practice. As a result, they found that when an underlayer made of a ferroelectric material with an piezoelectric effect is formed in lattice shape on a substrate, and a magnetic film with a magnetoelastic effect is formed on each crossing point of rows and columns of the underlayer, the lattice shaped underlayer works as a writer.

The writing process of MRAM of the present invention will be explained hereinafter, based on a conceptual view referring to the method. FIG. 2 is a conceptual view to explain the writing method for MRAM of the present invention.

The MRAM shown in FIG. 2 has a lattice shaped underlayer P made of a ferroelectric material with a piezoelectric effect on a substrate not shown in the figure. Then, the memory has magnetic films A1–E5 made of a magnetic material having a magnetoelastic effect on each crossing point of the columns X1–X5 and the rows Y1–Y5 of the underlayer P.

For example, to perform writing by reversing the flux of the film C3, a voltage is applied to the column X3 and to the row Y3 of the underlayer P. Consequently, a large stress is given rise on the crossing point of X3 and Y3 by the piezoelectric effect of the ferroelectric material constituting the underlayer P. The large stress is transmitted to the film C3 on the crossing point, leading to distortion of the film C3.

Since the magnetic films of the present MRAM are made of magnetic material with high magnetoelastic effect, the stress of the film C3 is converted to magnetoelastic energy. Then, the energy is converted into the magnetic energy by reversal of the magnetization.

Herein, only the crossing point of the column X3 and the row Y3 has a strong stress and other crossing points do not receive any stress strong enough to give rise to flux reversal in the films on them.

Writing for a MRAM of the present invention is carried out by taking advantage of the piezoelectric effect of the underlayer made of a ferroelectric material having a high piezoelectric effect and the magnetoelastic effect of films having a high magnetoelastic effect. When a voltage is applied to the underlayer, no current flows in the underlayer because it is highly resistive.

Thus, ohmic heat is negligible in this invention and the damage to the wirings in the conventional MRAM is removed, which leads to improved stability of operation for this new MRAM. Consequently, the new writing method removes limitations on high density MRAM caused by energy dissipation in the wirings.

BRIEF DESCRIPTION OF THE DRAWINGS

For better understanding of the present invention, some reference is made here about the attatched drawings.

DESCRIPTION OF THE PREFERRED EMBODIMENTS

Figure 1:
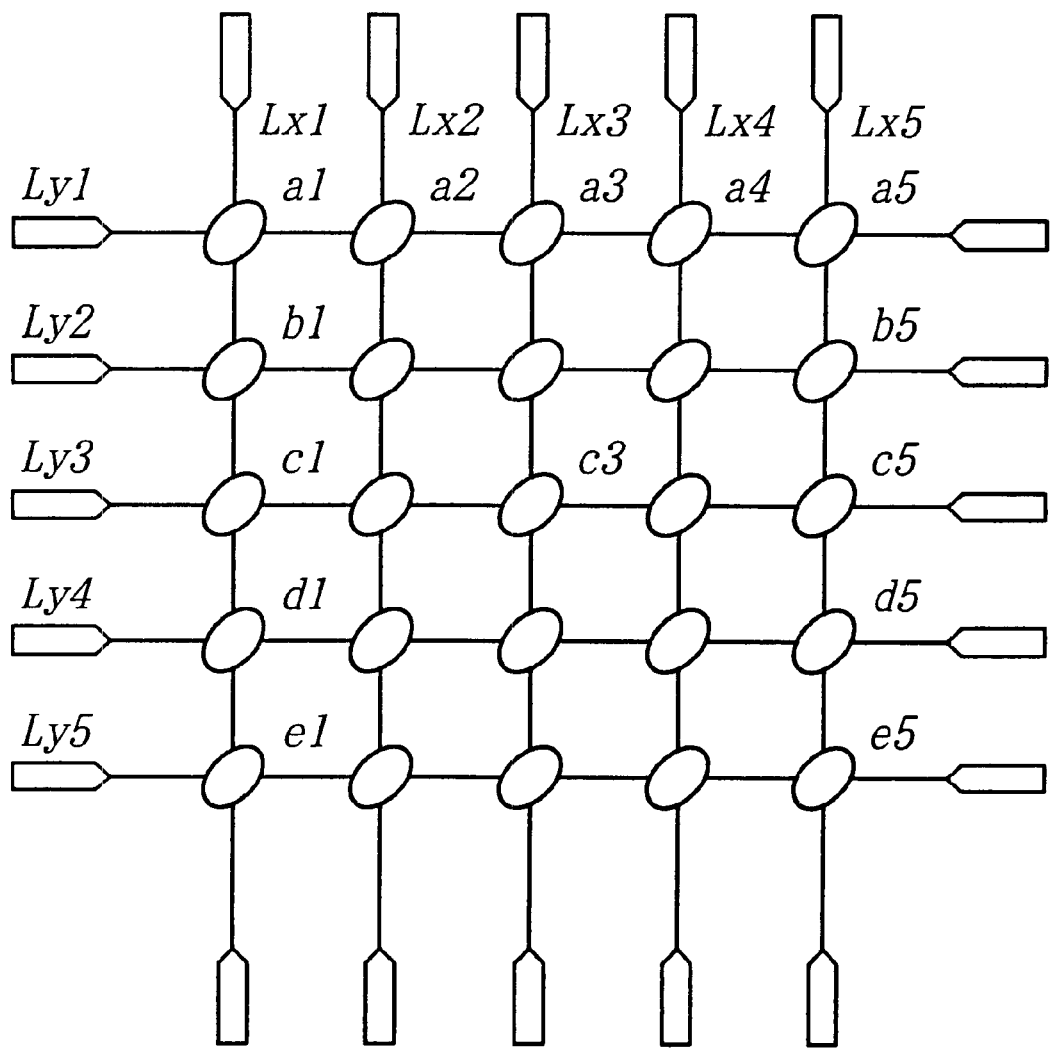
FIG. 1 is conceptual view for explanation of a writing method for a conventional M and FIG. 2 is a conceptual view for explanation of a writing method for a MRAM of the present invention.
Figure 2:
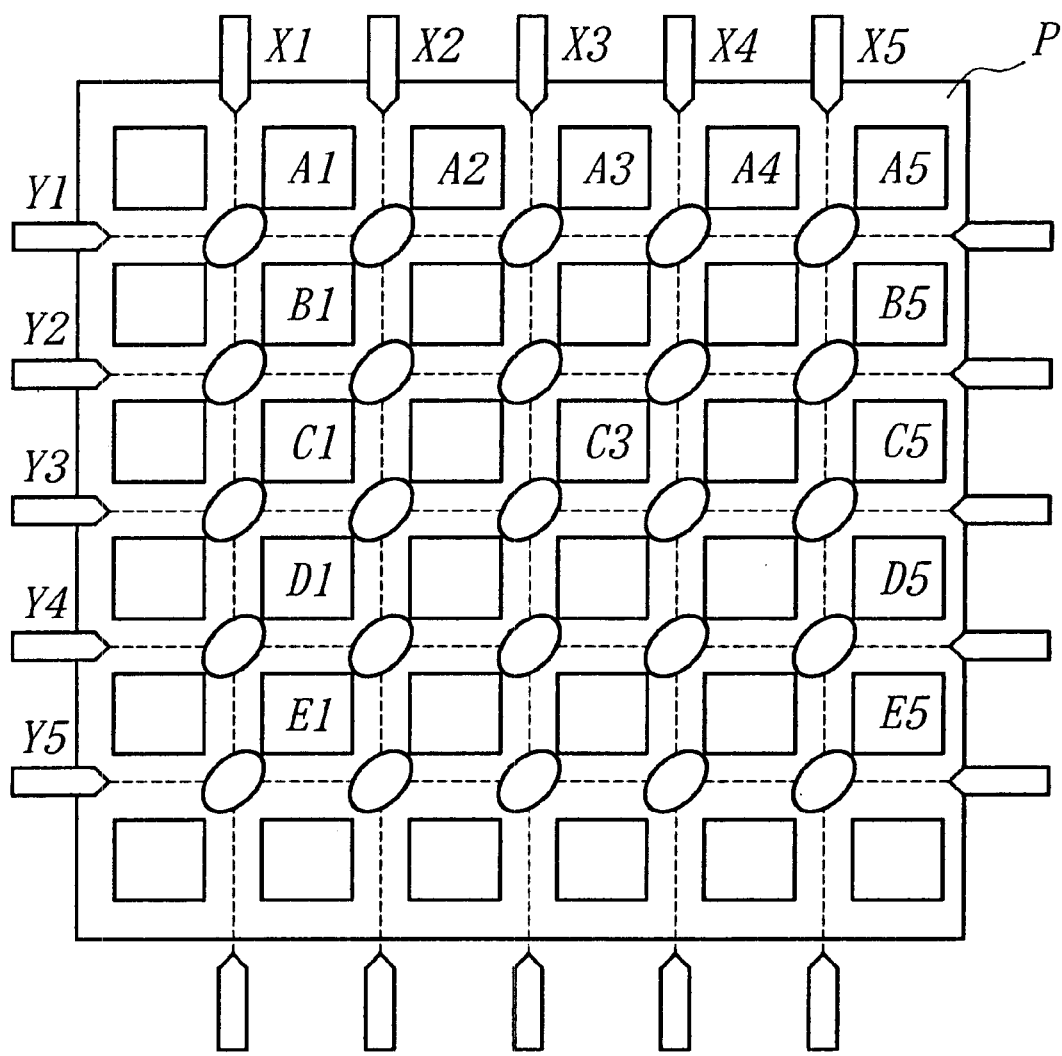

The invention will be described in detail as follows:

In the writing method for a MRAM and the MRAM of the present invention, the underlayer is required to be made of a ferroelectric material having a high piezoelectric effect. Any kind of the ferroelectric material will do only if writing can be carried out through the piezoelectric effect.

However, the underlayer is preferably made of the ferroelectric material having an electrostriction constant of $10^{-4}$ and over, more preferably of the material having an electrostriction constant of $10^{-3}$ and over. Thereby, irrespective of the thickness and lattice density of the underlayer, and the thickness and material of the magnetoelastic films on the underlayer, the magnetization in the film can easily be reverted by the stress from the underlayer.

As the ferroelectric material mentioned above, lead titanate, zinc oxide, lithium niobate and lead xirconate-lead titanate solid solution (PZT) are exemplified. The underlayer is preferably made of at least one of the ferroelectric materials.

The structure of the magnetic film is not restricted only if the film is sensitive enough to stress of the underlayer to convert it to the magnetic energy bringing about flux reversal through the magnetoelastic effect.

However, it is preferable that the magnetic film has a magnetostriction constant of 10–5 and over, particularly 10–4 and over. Thereby, being independent of the thickness of the magnetic films, the kind of the ferroelectric material of the underlayer and its lattice density, the flux reversal in the films can be made easily.

Moreover, the magnetic film is preferably made of at least one selected from the group consisting of Ni alloys, transition metal alloys such as Fe—Co,Fe—Ni,Co—Pd,Fe—Al, alloys composed of a transition metal plus metallic elements in a series of in a periodic table and rare earth metal-transition metal alloys.

Furthermore, the magnetic film is preferably in an amorphous state of the above materials. Thereby, the magnetization of the magnetic film can be easily reverted, irrespective of the thickness of the magnetic film and the kind of the ferroelectric material of the underlayer. Then, by appropriate selection of the material of the magnetic film having a magnetostriction constant of $10^{-5}$ and over can be easily obtained.

The substrate may be made of well-known material such as thermally oxidized silicon or glass. Moreover, a buffer layer may be provided between the substrate and the underlayer for controlling of the crystal state of the ferroelectric underlayer The written information in MRAM of the present invention is read out with a magnetization detector composed of an artificial multilayer, which is made of magnetic layers and non-magnetic layers. Wiring for reading is made on this artificial multilayer to detect a resistive change in the multilayer depending on the flux direction in the magnetic film.

The lattice shaped underlayer is formed as follows: After a thin film of ferroelectric material is formed on a substrate, a positive type photoresist formed on the film is exposed and patterned in lattice shape.

EXAMPLES

This invention is described concretely in the following examples, but is not restricted to these examples.

A surface oxidized Si wafer is chosen as the substrate mentioned above and, by exposing and developing process described above, a lattice shaped underlayer of PZT with thickness of 250 nm having a vertical and lateral lattice period of 1 82 m was formed. Then, through the exposing and developing process, magnetic patterns of Ni with thickness of 20 nm are formed on the crossing points of the underlayer.

Subsequently, an artificial multilayer of FeNi/Co/Cu/Co and wiring for reading were formed.

When a voltage of 5–6V was applied to the terminals of a column and a row of the underlayer, the flux of the chosen magnetic film was reverted.

That is, it was experimentally confirmed that writing by the present invention was practically possible.

Although the present invention has been described in detail with the above examples, this invention is not limited to the above disclosure and every kind of variation and modification may be made without departing from the scope of the present invention.

Acceding to the present invention, the conventional writing wirings are not needed for MRAM operation. The ohmic heat from the wire current could be removed and that makes it possible to develop a MRAM with much higher memory density.

What is claimed is:

1. A writing method for a MRAM comprising the steps of:
   forming, on a substrate, a lattice shaped underlayer of a ferroelectric material having a piezoelectric effect,
   forming, on the crossing points of the lattice, magnetic films having a magnetoresistive effect, and
   applying a certain voltage to a given row and column of the lattice and thereby, causing flux reversal in the magnetic film on the crossing point, whereby writing the MRAM is completed.

2. A writing method for a MRAM as defined in claim 1, wherein the underlayer is made of ferromagnetic material having a piezoelectric constant of $10^{-4}$ and over.

3. A writing method for a MRAM as defined in claim 2, wherein the underlayer is made of at least one material chosen from the group consisting of lead titanate, zinc oxide, lithium niobate and lead zirconate-lead titanate solid solution.

4. A writing method for a MRAM as defined in claim 3, where in the magnetic films are made of a magnetic material having a magnetoresistive contact of 10–5 and over.

5. A wiring method of a MRAM as defined in claim 3, wherein the magnetic film is amorphous.

6. A writing method for a MRAM as defined in claim 2, where in the magnetic films are made of a magnetic material having a magnetoresistive contact of 10–5 and over.

7. A wiring method of a MRAM as defined in claim 2, wherein the magnetic film is amorphous.

8. A writing method for a MRAM as defined in claim 1, wherein the magnetic films are made of a magnetic material having a magnetoresistive constant of $10^{-5}$ and over.

9. A writing method for a MRAM as defined in claim 1, wherein the magnetic film is amorphous.

10. A MRAM comprising of a substrate, an underlayer made of a ferroelectric material having an piezoelectric effect, magnetic films having a magnetoresistive effect, the underlayer in a lattice shape on the substrate, the magnetic films formed on crossing points of the lattice of the underlayer.

* * * * *

UNITED STATES PATENT AND TRADEMARK OFFICE
CERTIFICATE OF CORRECTION

PATENT NO. : 6,339,543 B1
DATED : January 15, 2002
INVENTOR(S) : Shimada et al.

It is certified that error appears in the above-identified patent and that said Letters Patent is hereby corrected as shown below:

Title page,
Item [*] Notice, delete the phrase "by 50 days" and insert -- by 0 days --

Signed and Sealed this

Nineteenth Day of October, 2004

JON W. DUDAS
*Director of the United States Patent and Trademark Office*